United States Patent
Kwak

(10) Patent No.: US 7,586,142 B2
(45) Date of Patent: Sep. 8, 2009

(54) SEMICONDUCTOR DEVICE HAVING METAL-INSULATOR-METAL CAPACITOR AND METHOD OF FABRICATING THE SAME

(75) Inventor: Sung-Ho Kwak, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/944,588

(22) Filed: Nov. 23, 2007

(65) Prior Publication Data
US 2008/0128856 A1 Jun. 5, 2008

(30) Foreign Application Priority Data
Dec. 5, 2006 (KR) ...................... 10-2006-0121936

(51) Int. Cl.
*H01L 27/108* (2006.01)
(52) U.S. Cl. ............... 257/301; 257/306; 257/E27.016; 438/243
(58) Field of Classification Search ................. 257/296, 257/301, 303, 306, 516, 532, E27.016, E27.024, 257/E27.033, E27.092, E29.342, E29.343, 257/E29.345, E29.346; 438/210, 239, 243, 438/244, 253, 386, 387, 396, FOR. 220, FOR. 430
See application file for complete search history.

(56) References Cited

U.S. PATENT DOCUMENTS 6,723,600 B2 *   4/2004   Wong et al. .................. 438/244
2002/0019123 A1 *  2/2002  Ma et al. ..................... 438/622
2002/0179566 A1 * 12/2002  Park ............................. 216/13
2003/0027385 A1 *  2/2003  Park et al. ................... 438/253
2003/0027386 A1 *  2/2003  Lee ............................. 438/253
2003/0203570 A1 * 10/2003  Song et al. .................. 438/254
2004/0175883 A1 *  9/2004  Kim ........................... 438/244
2006/0249768 A1 * 11/2006  Izumi ......................... 257/295
2007/0205248 A1 *  9/2007  Horng et al. .................. 228/19

* cited by examiner

*Primary Examiner*—Wai-Sing Louie
(74) *Attorney, Agent, or Firm*—Sherr & Vaughn, PLLC

(57) ABSTRACT

A semiconductor device having a metal-insulator-metal (MIM) capacitor is provided and can include a lower line formed in a semiconductor substrate; a first interlayer insulating layer formed over the semiconductor substrate, the first interlayer insulating layer having a first conductor and a second conductor electrically connected to the lower line; a second interlayer insulating layer formed over the first interlayer insulating layer, the second interlayer insulating layer including a first via hole and a second via hole connected to the first conductor and the second conductor, respectively; a lower electrode line formed in the first via hole, the lower electrode including a first barrier metal layer, a second barrier metal layer, a second copper seed layer, and a copper layer; and a capacitor formed in the second via hole, the capacitor including the first barrier metal layer, a dielectric layer, the second barrier metal layer and the second copper seed layer.

20 Claims, 4 Drawing Sheets

SEMICONDUCTOR DEVICE HAVING METAL-INSULATOR-METAL CAPACITOR AND METHOD OF FABRICATING THE SAME

The present application claims priority under 35 U.S.C. 119 to Korean Patent Application No. 10-2006-0121936 (filed on Dec. 5, 2006), which is hereby incorporated by reference in its entirety.

BACKGROUND

Aspects of semiconductor fabrication have focused on developing integrated circuits including high-speed and large-capacity analog capacitors formed in a logic circuit region. In order to obtain high-speed capacitors, it may be necessary to lower the resistance of electrodes of the capacitors and decrease frequency dependency. Further, in order to obtain large-capacity capacitors, it may be necessary to decrease the thickness of a capacitor dielectric layer and incorporate a high-dielectric dielectric layer or increase the overall area of the capacitor.

A high-capacity capacitor may include a polysilicon-insulator-polysilicon (PIP) structure in which an upper electrode and a lower electrode may be used as conductive polysilicon. This structure, however, may present problems such as a decrease in capacitance due to oxidization at the interface of the upper electrode and the lower electrode. Such oxidation may produce an insulating thin film and a native oxide layer at the interface.

In order to eliminate such oxidation at the interface, capacitors having a metal-insulator-metal (MIM) structure. A MIM type capacitor may have low resistivity and does not exhibit parasitic capacitance due to depletion therein. Accordingly, MIM capacitors may be used as high-performance semiconductor devices requiring a high Q value.

Figure 1:
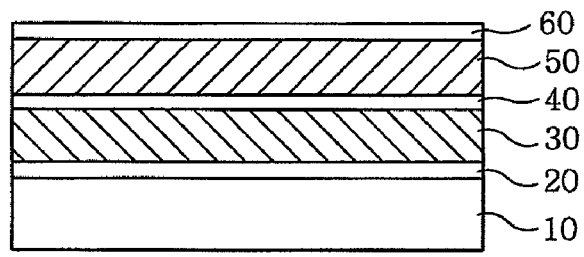

As illustrated in example FIG. 1, a logic process for a semiconductor device that may include interlayer insulating layer 20 formed on and/or over silicon semiconductor substrate 10. Metal layer 30 for a lower electrode, dielectric layer 40, metal layer 50 for an upper electrode, and hard mask layer 60 may be sequentially formed on and/or over interlayer insulating layer 20. Dielectric layer 40 may be composed of silicon nitride or an oxide. Hard mask film 60 may serve as a hard mask in a subsequent upper electrode etch process and a subsequent via hole etch process. Hard mask film 60 may be composed of silicon nitride, nitride, oxide nitride or the like.

Figure 2:
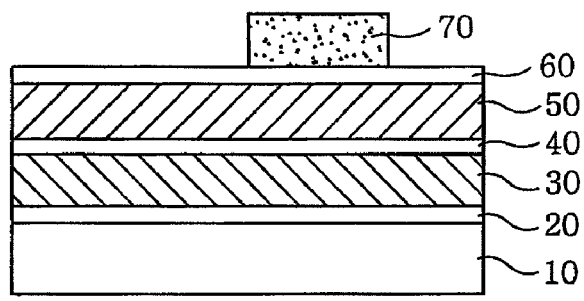

As illustrated in example FIG. 2, a photolithographic process may be performed to form first photoresist pattern 70 on which the upper electrode of the MIM capacitor will be patterned on the hard mask layer 60. The hard mask layer 60 is selectively etched by a reactive ion etch process employing plasma, thus forming a hard mask film pattern 61. The metal layer 50 for the upper electrode is etched by a dry etch process employing plasma by using the hard mask layer pattern 61 as an etch mask, thus forming an upper electrode 51 of the capacitor.

Figure 3:
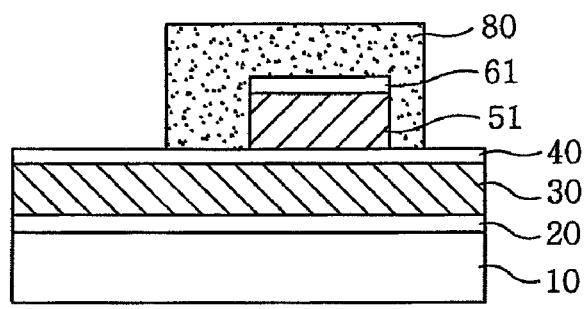
Figure 4:
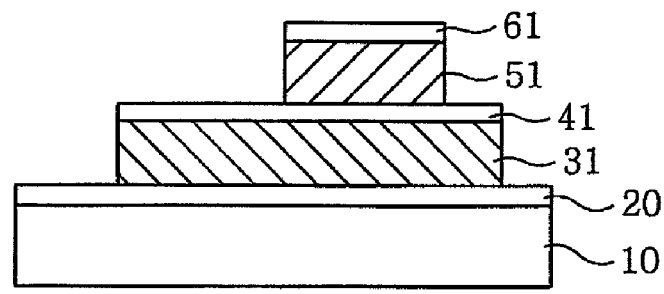

As illustrated in example FIGS. 3 and 4, after first photoresist pattern 70 is removed, a photolithographic process may be performed to form second photoresist pattern 80 on which the lower electrode of the MIM capacitor will be patterned. Dielectric layer 40 may be selectively etched using a reactive ion etch (RIE) process employing plasma to form dielectric layer pattern 41.

Metal layer 30 for the lower electrode may be etched using a dry etch process employing plasma by using dielectric layer pattern 41 as an etch mask to form lower electrode 31 of the capacitor. Second photoresist pattern 80 may then be removed.

Figure 5:
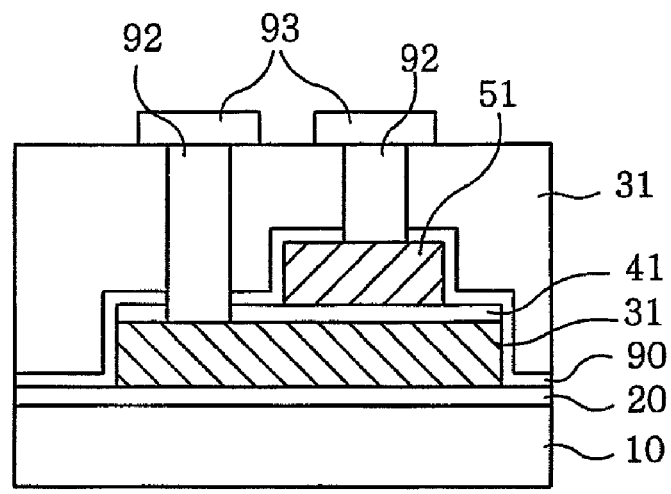

As illustrated in example FIG. 5, capping nitride layer 90 composed of SiN may be formed on and/or over semiconductor substrate 10 in which lower electrode 31 is formed. Capping nitride layer 90 may serve to prevent the diffusion of lower electrode 31. Inter-metal insulating layer 91 may be formed on and/or over capping nitride layer 90. The resulting surface may be polished using a chemical mechanical polishing (CMP) process.

Thereafter, portions of inter-metal insulating layer 91 may be selectively etched. Via holes through which the uppermost surface of lower electrode 31 and upper electrode 51 are exposed may be formed using a photolithographic process. A conductive layer may be buried in the via holes to form contact plugs 92. A metal layer may be deposited on and/or over inter-metal insulating layer 91 and then patterned through known processes. Thus, metal lines 93 connected to lower electrode 31 and upper electrode 51, respectively, may be formed through contact plugs 92.

However, such an MIM capacitor structure can be disadvantageous due to the fabrication complexity that requires formation of several mask and etching processes. This, in turn, increases overall production time and production costs.

Even still, in order to increase the capacity of such an MIM capacitor structure, it may be necessary to increase the overall area of the MIM capacitor. This may become difficult to achieve due to limitations in reducing the thickness of the dielectric layer.

SUMMARY

Embodiments relate to a semiconductor device having a metal-insulator-metal (MIM) capacitor that can be fabricated using a reduced number of processes by forming the MIM capacitor using a damascene process.

Embodiments relate to a semiconductor device having a MIM capacitor that can be fabricated using a simplistic process and by which the capacity may be increased without increasing the overall capacitor area.

Embodiments relate to a semiconductor device having a MIM capacitor that can include: a lower line formed in a semiconductor substrate; a first interlayer insulating layer formed over the semiconductor substrate, the first interlayer insulating layer having a first conductor and a second conductor electrically connected to the lower line; a second interlayer insulating layer formed over the first interlayer insulating layer, the second interlayer insulating layer including a first via hole and a second via hole connected to the first conductor and the second conductor, respectively; lower electrode line formed in the first via hole, the lower electrode including a first barrier metal layer, a second barrier metal layer, a second copper seed layer, and a copper layer; and capacitor formed in the second via hole, the capacitor including the first barrier metal layer, a dielectric layer, the second barrier metal layer and the second copper seed layer.

Embodiments relate to a method of fabricating a semiconductor device having a MIM capacitor, including at least one of the following steps: providing a semiconductor layer having a lower line formed therein; forming a first interlayer insulating layer over the semiconductor substrate; forming a first conductor and a second conductor in the first interlayer insulating layer, the first conductor and a second conductor each being electrically connected to the lower line; forming a second interlayer insulating layer over the first interlayer insulating layer; forming a first via hole and a second via hole in the second interlayer insulating layer to expose the uppermost surfaces of the first conductor and the second conductor; sequentially forming a first barrier metal layer and a dielectric layer over the second interlayer insulating layer in which the first via hole and the second via hole are formed; etching the dielectric layer of the first via hole; and forming a second barrier metal layer, a second copper seed layer, and a copper layer over the second interlayer insulating layer in which the first via hole and the second via hole are formed.

Embodiments relate to a method of fabricating a semiconductor device having a MIM capacitor, including at least one of the following steps: forming a lower line formed in a semiconductor substrate; forming a first interlayer insulating layer over the semiconductor substrate; forming a second interlayer insulating layer over the first interlayer insulating layer; forming in the second interlayer insulating layer a first via hole and a second via hole; forming a lower electrode line in the first via hole electrically connected to the lower line; and then forming a capacitor in the second via hole electrically connected to the lower line. In accordance with embodiments, the lower electrode can include a first barrier metal layer, a second barrier metal layer, a first copper seed layer, a second copper seed layer, and a copper layer. In accordance with embodiments, the capacitor can include the first barrier metal layer, a dielectric layer, the second barrier metal layer, the first copper seed layer and the second copper seed layer.

DRAWINGS

Example FIGS. 1 to 5 illustrate a MIM capacitor.

Example FIGS. 6 to 9 illustrate a MIM capacitor, in accordance with embodiments.

DESCRIPTION

As illustrated in example FIGS. 6 to 9, a semiconductor device having a MIM capacitor in accordance with embodiments can include lower line 110 formed in semiconductor substrate 100. First interlayer insulating layer 120 can be formed on and/or over semiconductor substrate 100 including lower line 110. First conductor 130 and second conductor 140 can extend through first interlayer insulating layer 120 and can be electrically connected to lower line 110. Second interlayer insulating layer 150 can be formed on and/or over first interlayer insulating layer 120.

First via hole 160 and second via hole 170, through which the uppermost surface of first conductor 130 and second conductor 140 can be exposed, respectively, can be formed in second interlayer insulating layer 150 using a damascene process. First barrier metal layer 180, first copper (Cu) seed layer 190, and dielectric layer 200 can then be formed sequentially therein.

Photoresist pattern 230 can be formed on and/or over portions of second interlayer insulating layer 150 except first via hole 160, which remains exposed. Dielectric layer 200 of first via hole 160 can be etched by an etch process and photoresist pattern 230 can then be removed. Second barrier metal layer 210, second copper seed layer 220, and copper layer 250 can be deposited, and a polishing process is then conducted. Thus, first via hole 160 can have a stacked structure including first barrier metal layer 180, first copper seed layer 190, second barrier metal layer 210, second copper seed layer 220, and copper layer 250. Accordingly, first via hole 160 is electrically connected to first barrier metal layer 180 of second via hole 170 through first conductor 130, lower line 110, and second conductor 140.

On the other hand, second via hole 170 can have a stacked structure including first barrier metal layer 180, first copper seed layer 190, dielectric layer 200, second barrier metal layer 210, second copper seed layer 220, and copper layer 250. First barrier metal layer 180 can be electrically connected to lower line 110 and second barrier metal layer 210 can be electrically connected to the upper line. Thus, a MIM capacitor can be formed including first barrier metal layer 180, dielectric layer 200, and second barrier metal layer 210.

A semiconductor device having an MIM capacitor in accordance with embodiments can be fabricated by providing a semiconductor substrate 100 that includes lower line 110 formed therein. First interlayer insulating layer 120 can be formed on and/or over semiconductor substrate 100 and first conductor 130 and second conductor 140 can be formed to extend through first interlayer insulating layer 120 and electrically connected to lower line 110.

Second interlayer insulating layer 150 can be formed on and/or over first interlayer insulating layer 120. First via hole 160 and second via hole 170 can be formed in second interlayer insulating layer 150. First barrier metal layer 180, first copper seed layer 190 and dielectric layer 200 can be sequentially formed on and/or over second interlayer insulating layer 150 including first via hole 160 and second via hole 170. Dielectric layer 200 can be removed of only first via hole 160 using a photolithographic process. Second barrier metal layer 210, second copper seed layer 220, and copper layer 250 can be sequentially stacked. A polishing process can then be performed on the resulting surface. In accordance with embodiments, the use of a mask and an etch process can significantly reduce the overall process time.

A capacitor having can have a structure that includes first barrier metal layer 180, dielectric layer 200, and second barrier metal layer 210 formed in second via hole 170. This structure can increase the capacity of the capacitor per unit area.

Figure 6:
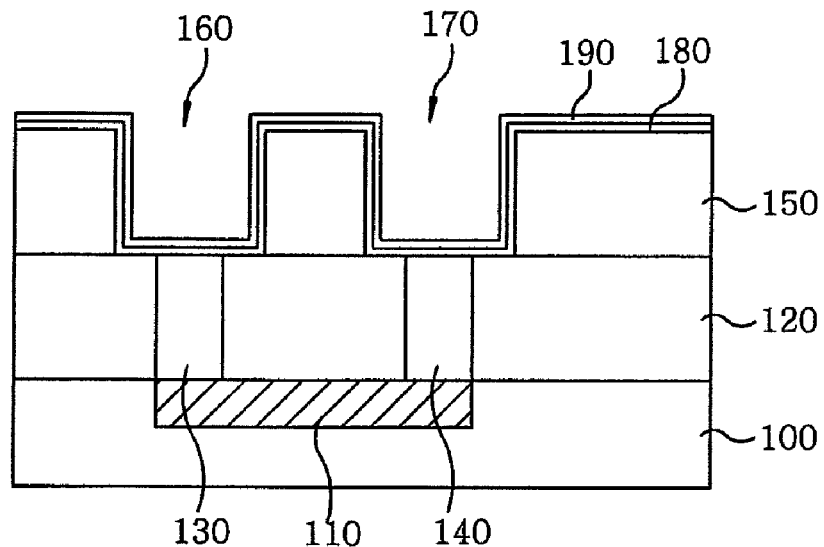

As illustrated in example FIG. 6, first interlayer insulating layer 120 can be formed on and/or over semiconductor substrate 100 including lower line 110. A first contact hole and a second contact hole, each connected to lower line 110, can be formed in first interlayer insulating layer 120 using a photolithographic process. The first and second contact holes can be gap-filled with conductive material, such as metal, to form first conductor 130 and second conductor 140. First conductor 130 and second conductor 140 can be electrically connected to lower line 110, and themselves, are electrically connected to each other. The uppermost surface of first interlayer insulating layer 120 can be polished using a CMP process. First interlayer insulating layer 120 can be composed of at least one of SiN, $SiO_2$, $Al_2O_3$ and $HfO_2$. First conductor 130 and second conductor 140 can be composed of at least one of Ta and TiN.

Second interlayer insulating layer 150 can be formed on and/or over first interlayer insulating layer 120. Second interlayer insulating layer 120 can be composed of the same material as first interlayer insulating layer 120, particularly at least one of SiN, $SiO_2$, $Al_2O_3$ and $HfO_2$. Patterns can then be formed on and/or over second interlayer insulating layer 150 using a damascene process. First via hole 160 and second via hole 170 can be formed in second interlayer insulating layer 150 to exposed the uppermost surface of first conductor 130 and second conductor 140. If first via hole 160 and second via hole 170 have substantially the same size, first barrier metal layer 180, second barrier metal layer 210, first copper seed layer 190, second copper seed layer 220, and dielectric layer 200 can be stacked therein.

The damascene process can be performed as follows. A metal such as aluminum has been used as lines of semiconductor chips due to having low contact resistance and a simple process characteristic. However, as semiconductor chips become more highly integrated, such aluminum lines experience junction spike failure, and electromigration phenomenon, and thus, are difficult to be incorporate as lines of highly integrated semiconductor chips. Moreover, in order to increase the response speed of semiconductor chips, a line composed of a metal having a resistance lower than that of aluminum can be used.

Accordingly, a low-dielectric insulating layer having a metal such as copper can be used as lines. Copper has low resistance and also does not generate electromigration phenomenon. However, copper cannot be easily processed using a photolithographic process because it rapidly diffuses in silicon or most metal layers. Thus, the copper material can be processed using a damascene process.

The damascene process is a process of etching part of the insulating layer through a photolithographic process to form trenches, depositing a copper seed, polishing the resulting surface using CMP, and gap-filling the trench regions with copper to form copper lines.

Accordingly, first via hole 160 and second via hole 170 can be formed to expose uppermost surfaces of first conductor 130 and second conductor 140 using a damascenes process in second interlayer insulating layer 150. First barrier metal layer 180 can then be deposited on and/or over second interlayer insulating layer 150. First barrier metal layer 180 can be used as lower line 110 in first via hole 160, and can be electrically connected to second conductor 140 and will then used as the lower electrode of the MIM capacitor in second via hole 170. First barrier metal layer 180 can be composed of at least one of Ta and TiN.

After formation of first via hole 160 and second via hole 170 in second interlayer insulating layer 150, first barrier metal layer 180 and first copper seed layer 190 can be sequentially formed on and/or over second interlayer insulating layer 150. If first barrier metal layer 180 and first copper seed layer 190 are deposited twice, the resistance and an overall thickness of the lower electrode can be increased.

Dielectric material for forming dielectric layer 200 can be deposited having a predetermined thickness over first barrier metal layer 180 and first copper seed layer 190. Dielectric layer 200 can serve as an insulator of the MIM capacitor. Dielectric layer 200 can be composed of at least one of SiN, $SiO_2$, $Al_2O_3$ and $HfO_2$ and can be deposited using a chemical vapor deposition (CVD) method.

Figure 7:
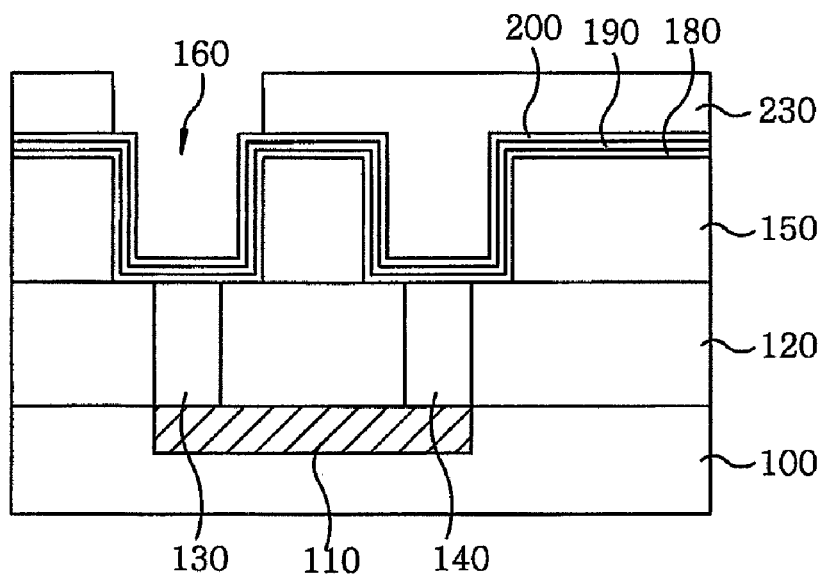

As illustrated in example FIG. 7, a photoresist can be deposited on and/or over dielectric layer 200. In order to etch dielectric layer 200 of first via hole 160 through exposure and development processes, photoresist pattern 230 can be formed to expose the uppermost surface of first via hole 160. Dielectric layer 200 formed in first via hole 160 can be etched using photoresist pattern 230 as an etch mask.

Figure 8:
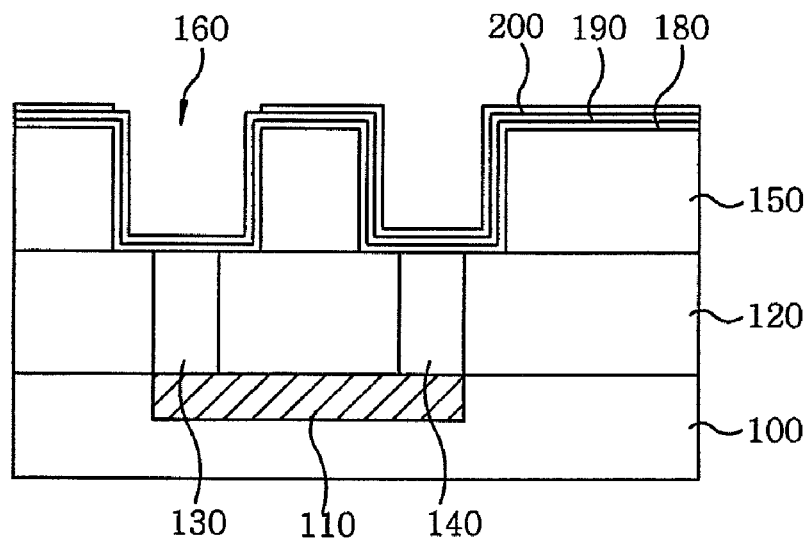

As illustrated in example FIG. 8, if photoresist pattern 230 is removed, a complete structure can include first barrier metal layer 180 and first copper seed layer 190 sequentially stacked in first via hole 160, and first barrier metal layer 180, first copper seed layer 190, and dielectric layer 200 sequentially stacked in second via hole 170.

Figure 9:
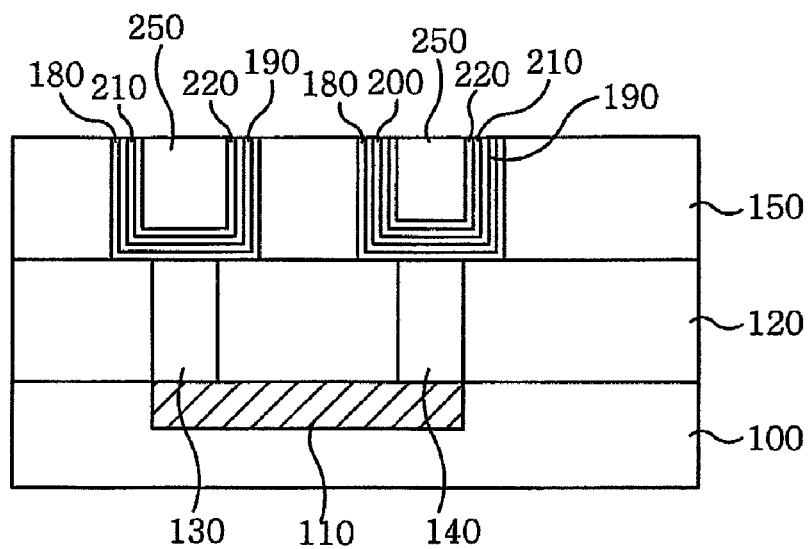

As illustrated in example FIG. 9 second barrier metal layer 210 and second copper seed layer 220 can be sequentially formed on and/or over second interlayer insulating layer 150, first via hole 160 and second via hole 170. Second barrier metal layer 210 serves to preclude diffusion of copper from copper layer 250, improve the adhesion of dielectric layer 200 and copper, and also prohibit interlayer separation and electron migration which may occur at the time of an annealing process. First barrier metal layer 180 and second barrier metal layer 210 can be composed of the same material. First barrier metal layer 180 and second barrier metal layer 210 can be composed of at least one of Ta, TaN, TiN, WN, TaC, WC, TiSiN, TaSiN and combinations thereof. First barrier metal layer 180 and second barrier metal layer 210 can be deposited using at least one of a physical vapor deposition (PVD), CVD, and atomic layer deposition (ALD).

Second copper seed layer 220 can serve as a basis for a subsequent ECP process, and also to provide a nucleus creation location for forming copper layer 250 using ECP. Second copper seed layer 220 can be formed using a PVD method.

After copper layer 250 is deposited on and/or over first via hole 160 and second via hole 170 through an ECP process, second interlayer insulating layer 150 can be polished by using dielectric layer 200 as an etch-stop film, thus forming the lower electrode line, the upper electrode line, the lower electrode, and the upper electrode.

Accordingly a semiconductor device can be formed having a structure which can include first via hole 160 and second via hole 170 which can be formed using a damascene process. First barrier metal layer 180, first copper seed layer 190, second barrier metal layer 210, second copper seed layer 220, and copper layer 250 can be sequentially stacked in first via hole 160. Since first barrier metal layer 180, first copper seed layer 190, second barrier metal layer 210, second copper seed layer 220, and copper layer 250 can be composed of conductive material, and can be electrically connected to lower line 110, first conductor 130, and second conductor 140, and can then be electrically connected to first barrier metal layer 180 of second via hole 170 used as the lower electrode since they serve as the lower electrode lines.

First barrier metal layer 180, first copper seed layer 190, dielectric layer 200, second barrier metal layer 210, second copper seed layer 220, and copper layer 250 can be sequentially stacked in second via hole 170. First barrier metal layer 180 can be electrically connected to the lower electrode line and second barrier metal layer 210 can be electrically connected to copper layer 250 which serves as the upper electrode line. First barrier metal layer 180 may serve as the lower electrode, dielectric layer 200 can serve as an insulator, and second barrier metal layer 210 can serve as the upper electrode. Accordingly, an MIM capacitor is formed having the structure including a lower electrode, an insulator and an upper electrode.

In accordance with embodiments, the semiconductor device having the MIM capacitor is advantageous since the capacitor can formed using a damascene process to thereby reduce the overall number of masks and etching processes. This, in turn, reduces overall processing time and processing costs, and also increase both the effective area of the capacitor and the capacity of a capacitor per unit area.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   a lower line formed in a semiconductor substrate;
   a first interlayer insulating layer formed over the semiconductor substrate, the first interlayer insulating layer having a first conductor and a second conductor electrically connected to the lower line;
   a second interlayer insulating layer formed over the first interlayer insulating layer, the second interlayer insulating layer including a first via hole and a second via hole connected to the first conductor and the second conductor, respectively;
   a lower electrode line formed in the first via hole, the lower electrode including a first barrier metal layer, a second barrier metal layer, a second copper seed layer, and a copper layer; and
   a capacitor formed in the second via hole, the capacitor including the first barrier metal layer, a dielectric layer, the second barrier metal layer and the second copper seed layer.

2. The apparatus of claim 1, wherein the first barrier metal layer and the second barrier metal layer are composed of the same material.

3. The apparatus of claim 1, wherein the first barrier metal layer and the second barrier metal layer are composed of at least one of Ta and TiN.

4. The apparatus of claim 1, wherein the dielectric layer is formed of a material selected from a group consisting of SiN, $SiO_2$, $Al_2O_3$ and $HfO_2$.

5. The apparatus of claim 1, wherein:
   the lower electrode line further includes a first copper seed layer interposed between the first barrier metal layer and the second barrier metal layer;
   the capacitor further includes the first copper seed layer interposed between the first barrier metal layer and the dielectric layer.

6. A method comprising:
   providing a semiconductor layer having a lower line formed therein;
   forming a first interlayer insulating layer over the semiconductor substrate;
   forming a first conductor and a second conductor in the first interlayer insulating layer, the first conductor and the second conductor each being electrically connected to the lower line;
   forming a second interlayer insulating layer over the first interlayer insulating layer;
   forming a first via hole and a second via hole in the second interlayer insulating layer to expose the uppermost surfaces of the first conductor and the second conductor;
   sequentially forming a first barrier metal layer and a dielectric layer over the second interlayer insulating layer in the first via hole and the second via hole;
   etching the dielectric layer of the first via hole; and then
   forming an electrode line in the first via hole and a capacitor in the second via hole by forming a second barrier metal layer, a second copper seed layer, and a copper layer over the second interlayer insulating layer in the first via hole and in the second via hole.

7. The method of claim 6, wherein the lower line is composed of at least one of Ta and TiN.

8. The method of claim 6, wherein the first interlayer insulating layer and the second interlayer insulating layer are composed of a material selected from a group consisting of SiN, $SiO_2$, $Al_2O_3$ and $HfO_2$.

9. The method of claim 6, wherein the first conductor and the second conductor are composed of the same material.

10. The method of claim 6, wherein the first conductor and the second conductor are composed of at least one of Ta and TiN.

11. The method of claim 6, wherein the first barrier metal layer and the second barrier metal layer are composed of the same material.

12. The method of claim 6, wherein the first barrier metal layer and the second barrier metal layer are composed of at least one of Ta and TiN.

13. The method of claim 6, further comprising forming a first copper seed layer after forming the first barrier metal layer.

14. The method of claim 6, wherein etching the dielectric layer of the first via hole is performed using a photoresist process.

15. The method of claim 6, wherein the dielectric layer is formed of a material selected from a group consisting of SiN, $SiO_2$, $Al_2O_3$ and $HfO_2$.

16. A method comprising:
    forming a lower line formed in a semiconductor substrate;
    forming a first interlayer insulating layer over the semiconductor substrate;
    forming a second interlayer insulating layer over the first interlayer insulating layer;
    forming in the second interlayer insulating layer a first via hole and a second via hole;
    forming a lower electrode line in the first via hole electrically connected to the lower line; and then
    forming a capacitor in the second via hole electrically connected to the lower line,
    wherein the lower electrode includes a first barrier metal layer, a second barrier metal layer, a first copper seed layer, a second copper seed layer, and a copper layer, and the capacitor includes the first barrier metal layer, a dielectric layer, the second barrier metal layer, the first copper seed layer and the second copper seed layer.

17. The method of claim 16, wherein the lower line is composed of at least one of Ta and TiN.

18. The method of claim 16, wherein the first interlayer insulating layer and the second interlayer insulating layer are composed of a material selected from a group consisting of SiN, $SiO_2$, $Al_2O_3$ and $HfO_2$.

19. The method of claim 16, wherein the first barrier metal layer and the second barrier metal layer are composed of at least one of Ta and TiN.

20. The method of claim 16, wherein the dielectric layer is formed of a material selected from a group consisting of SiN, $SiO_2$, $Al_2O_3$ and $HfO_2$.

* * * * *